United States Patent
Zink et al.

(10) Patent No.: US 6,839,285 B2
(45) Date of Patent: Jan. 4, 2005

(54) PAGE BY PAGE PROGRAMMABLE FLASH MEMORY

(75) Inventors: Sébastien Zink, Aix En Provence (FR); Bruno Leconte, Rousset (FR); Paola Cavaleri, Rousset (FR)

(73) Assignee: STMicroelectronics S.A., Gentilly (FR)

( * ) Notice: Subject to any disclaimer, the term of this patent is extended or adjusted under 35 U.S.C. 154(b) by 587 days.

(21) Appl. No.: 09/737,170

(22) Filed: Dec. 14, 2000

(65) Prior Publication Data

US 2001/0021958 A1 Sep. 13, 2001

(30) Foreign Application Priority Data

Dec. 22, 1999 (FR) .............................. 99 16445

(51) Int. Cl.[7] .............................................. G06F 12/06
(52) U.S. Cl. ........................... 365/185.33; 365/189.05; 365/189.12; 365/221; 365/230.08; 365/235; 365/236; 365/238.5; 365/239; 365/240; 710/52; 710/58; 711/103; 711/217; 711/218; 711/219
(58) Field of Search .................... 365/185.2, 185.22, 365/185.29, 185.33, 189.01, 189.05, 189.07, 189.12, 221, 230.08, 235, 236, 238.5, 239, 240; 710/25, 29, 52, 58, 74; 711/1, 103, 217, 218, 219

(56) References Cited

U.S. PATENT DOCUMENTS

| | | |
|---|---|---|
| 4,402,065 A | 8/1983 | Taylor ........................ 365/189 |
| 4,763,305 A | 8/1988 | Kuo ............................ 365/200 |
| 5,299,162 A * | 3/1994 | Kim et al. ............. 365/185.17 |
| 5,363,330 A | 11/1994 | Kobayashi et al. ......... 365/185 |
| 5,488,711 A | 1/1996 | Hewitt et al. |
| 5,621,738 A | 4/1997 | Caywood et al. |
| 5,724,284 A * | 3/1998 | Bill et al. ................ 365/185.2 |

FOREIGN PATENT DOCUMENTS

| | | |
|---|---|---|
| DE | 19506957 | 8/1996 |
| EP | 0561271 | 9/1993 |
| EP | 0845787 | 3/1998 |
| EP | 1089289 A1 * | 4/2001 |
| FR | 2805653 A1 * | 8/2001 |
| JP | 2002276880 A * | 9/2002 |
| WO | 97/48101 | 12/1997 |

* cited by examiner

Primary Examiner—B. James Peikari
(74) Attorney, Agent, or Firm—Lisa K. Jorgenson; Allen, Dyer, Doppelt, Milbrath & Gilchrist, P.A.

(57) ABSTRACT

An integrated circuit memory includes a FLASH memory including a circuit for recording a word presented on its input without the possibility of recording simultaneously several words in parallel. The integrated circuit memory may include a buffer memory with a sufficient capacity to store a plurality of words, the output of which is coupled to the input of the FLASH memory. A circuit is also included for recording into the buffer memory a series of words to be recorded into the FLASH memory and recording into the FLASH memory the words first recorded into the buffer memory.

29 Claims, 4 Drawing Sheets

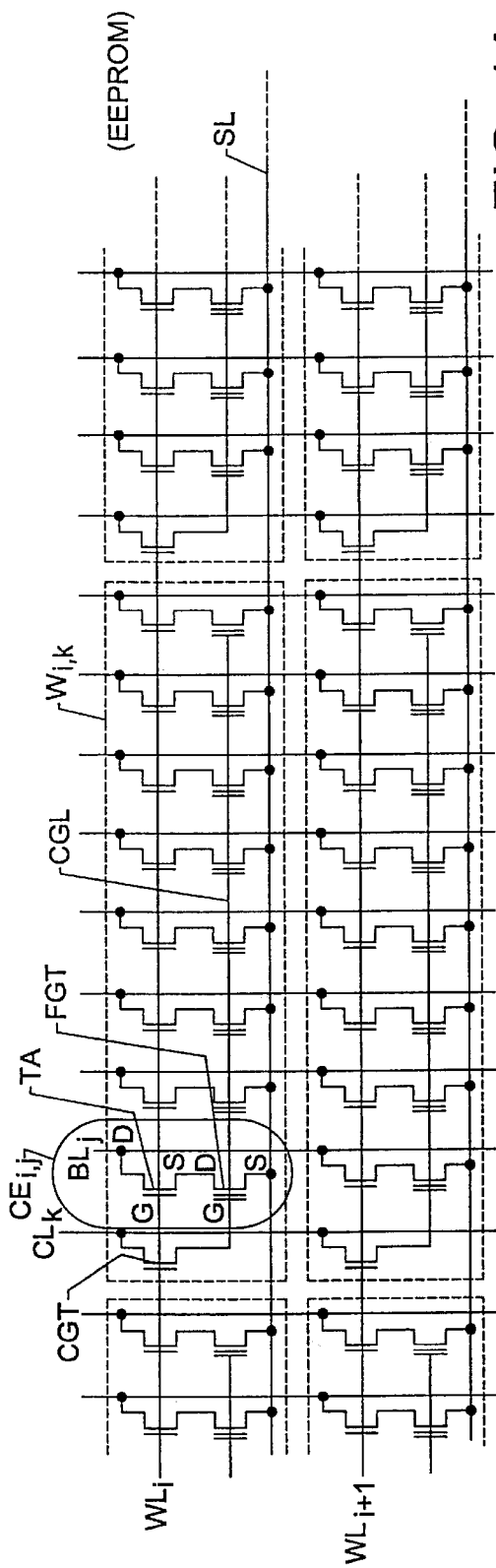
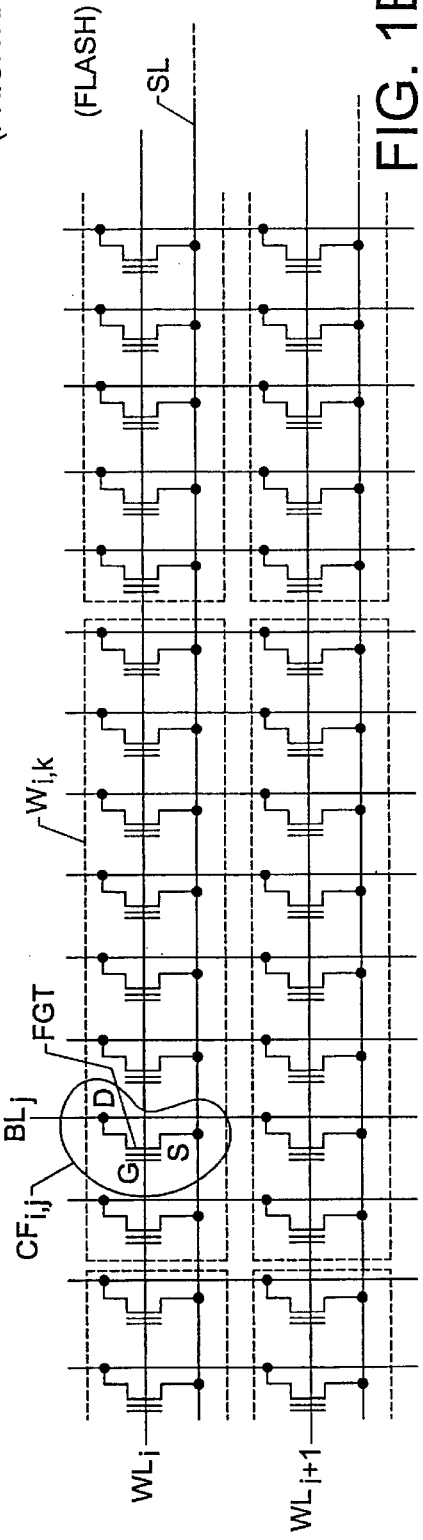
FIG. 1A (PRIOR ART)
FIG. 1B (PRIOR ART)

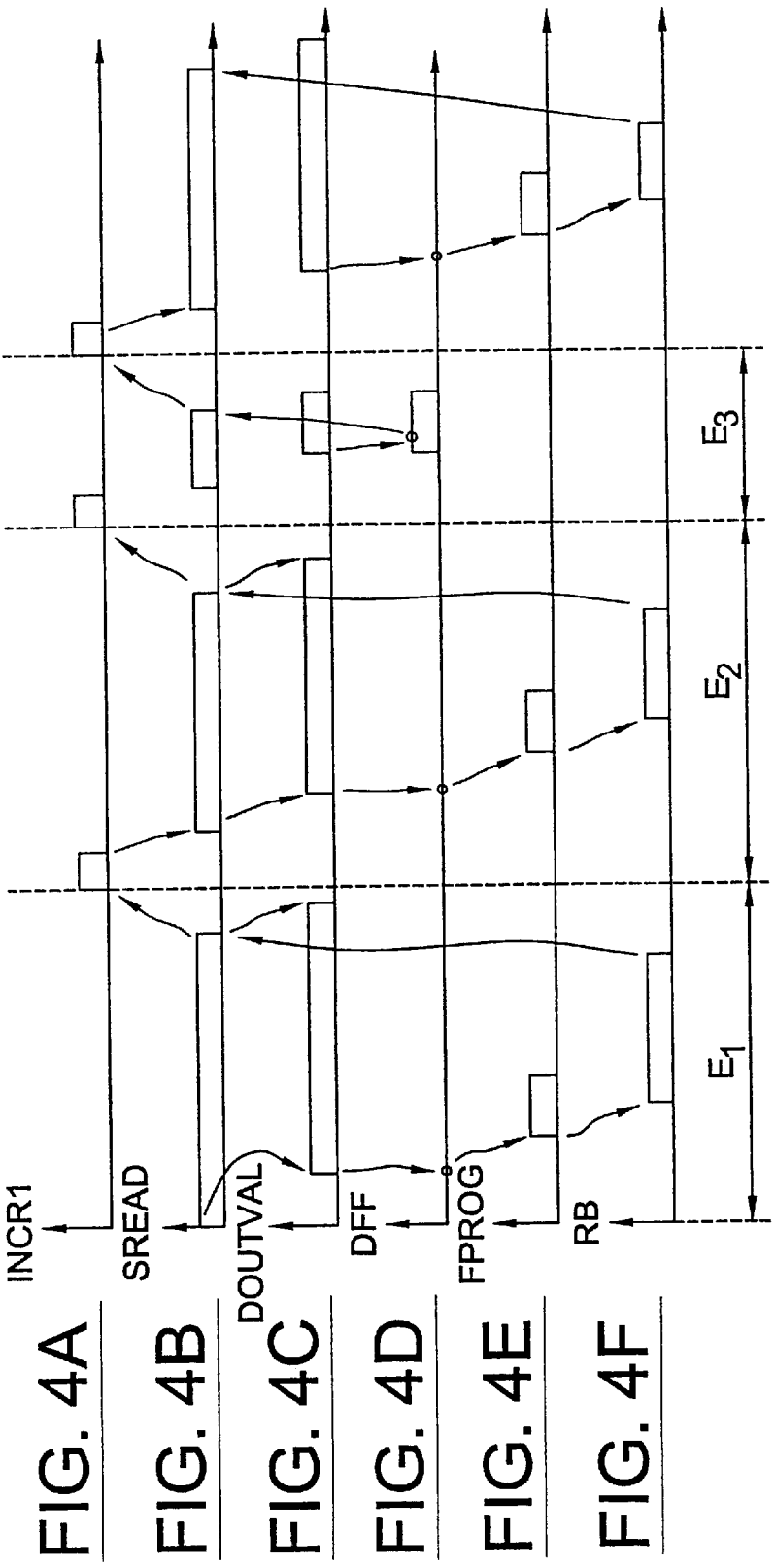

PAGE BY PAGE PROGRAMMABLE FLASH MEMORY

FIELD OF THE INVENTION

The present invention relates to electrically erasable and programmable memories, or EEPROM memories, and more particularly to FLASH-type EEPROM memories.

BACKGROUND OF THE INVENTION

At the present time, the market of electrically erasable and programmable integrated circuit memories is divided in three main memory categories. These are word by word programmable EEPROM memories, page by page programmable EEPROM memories (i.e., where a page includes a plurality of words), and word by word programmable FLASH (or FLASH-EEPROM) memories. Page by page programmable FLASH memories are presently not available for technological reasons which will be quickly understood with reference to FIGS. 1A and 1B. FIG. 1A shows schematically the core of an EEPROM memory, and FIG. 1B shows the core of a FLASH memory. Each memory includes a plurality of memory cells, respectively $CE_{i,j}$, $CF_{i,j}$, arranged in an array and connected to word lines $WL_i$ and bit lines BLJ.

In FIG. 1A, it can be seen that the cells $CE_{i,j}$ of the EEPROM memory include a floating gate transistor FGT and an access transistor TA. The access transistor TA has its gate G connected to a word line $WL_i$, its drain D connected to a bit line $BL_j$, and its source S connected to the drain D of transistor FGT. Transistor FGT has its gate G coupled to a column selection line $CL_k$ by a gate control line CGL and a gate control transistor CGT and its source S connected to a source line SL. The gate of transistor CGT is connected to the word line $WL_i$. Thus, the memory cells $CE_{i,j}$ of a same word line $WL_i$ are arranged in columns of k range, and form words $W_{i,k}$ (generally bytes). These words may be selected when reading by the column selection line $CL_k$ and the word line $WL_i$ to which they are linked.

In such an EEPROM memory, a programming or erasing operation of a cell includes injecting or extracting electric charges by the Fowler Nordheim effect into or from the floating gate of the transistor FGT of the cell. An erased transistor FGT presents a positive threshold voltage VT1, and a programmed transistor FGT presents a negative threshold voltage VT2. When a reading voltage Vread between VT1 and VT2 is applied to its gate, an erased transistor remains OFF, which corresponds by convention to a logic "0". A programmed transistor is conductive and corresponds by convention to a logic "1".

The erasing operation is performed by applying an erasing voltage VPP of about 12 to 20 V to the gate G of transistor FGT while the source line SL is set to ground. The programming operation is performed by applying a programming voltage VPP to the drain D of transistor FGT by the access transistor TA while the gate is set to ground.

With the charge transfers by the Fowler Nordheim effect being performed with a gate current nearly equal to zero, a great number of EEPROM memory cells may be erased or programmed simultaneously. Thus, as indicated above, EEPROM memories are available with page programming that allow, after a collective erasing operation of all the cells of a page (setting them to "0"), simultaneous programming of all the cells of the page which must contain the value "1". This may be done 256 cells at the same time, for example.

In FIG. 1B, it can be seen that the cells $CF_{i,j}$ of the FLASH memory have a very simple structure and include only one floating gate transistor FGT. Transistor FGT has its gate G connected to a word line $WL_i$, its drain D connected to a bit line $BL_j$, and its source S connected to a source line SL. The source S is sometimes connected to the source line SL by a source transistor (not shown), as described in European Patent Application No. EP704851. The arrangement of the cells of a same word may be progressive or interlaced so that a word $W_{i,k}$ linked to a line of range i and a column of range k may include eight cells arranged side by side, as represented in FIG. 1B. Or, in the case of interlaced cells, they may be non-adjacent cells. In this case, the physically adjacent cells are generally the same range of cells of the words of a same word line.

In such a FLASH memory, an erasing operation of a cell includes extracting electric charges trapped in the floating gate by the Fowler Nordheim effect. A programming operation includes injecting charges into the floating gate by the "hot electron injection" effect. An erased transistor FGT presents a positive threshold voltage VT1 with a small value, and a programmed transistor presents a threshold voltage VT2 higher than VT1. When a reading voltage Vread between VT1 and VT2 is applied to its gate, an erased transistor is ON, which corresponds by convention to a logic "1". A programmed transistor remains OFF, which corresponds by convention to a logic "0".

Because of their simplicity, FLASH memories have the advantage of being very compact in terms of occupied silicon surface. Thus, they present a storing capacity significantly higher than that of EEPROM memories, and they have a lower cost.

On the other hand, FLASH memories have less programming possibilities than EEPROM memories. This is particularly true regarding the possibility of recording simultaneously several words. As a matter of fact, the programming operation of a FLASH cell (by hot electron injection) is performed with a non-negligible current by applying to the cell transistor FGT a drain voltage of about 6 V and a gate voltage of about 12 V. The transistor FGT is in the ON state and highly biased during the operation.

Thus, if all the cells of a same sector in FLASH memories are frequently erased simultaneously (a sector comprising several word lines), the simultaneous programming of a great number of FLASH cells is, on the other hand, impossible due to the significant current collected in the source lines SL. This current is capable of destroying the metal tracks connecting the transistors of the memory and/or the connections between the tracks of different levels. In practice, the number of cells which can be simultaneously programmed is generally limited to eight. Thus, a FLASH memory cannot allow the simultaneous recording of several words, and it always operates in the "word by word" programming mode.

Although this drawback is offset by a very short programming time, in the order of microseconds as opposed to milliseconds for an EEPROM memory, the recording of a series of words into a FLASH memory requires sending a programming instruction for each recorded word. Conversely, a page by page programmable EEPROM memory requires one programming instruction only, followed by the series of the words to be recorded. The words are stored in a locked latch with a parallel output and are recorded simultaneously into the EEPROM memory in a single step.

Finally, there exist a lot of electronic circuits (e.g., microprocessor cards, micro-computer cards, sound cards, graphic cards, and the like) which include page by page programming EEPROM memories. These electronic circuits cannot operate with FLASH memories because their data transfer protocol is not compatible with such memories.

A FLASH memory including a writing protection device and a programming buffer circuit is disclosed in French Patent No. FR 2 756 410. This memory includes a plurality of high voltage registers in parallel connected to the bit lines of the memory, where each register is provided for storing a word. The structure of such memory allows the imitation of the page mode of EEPROM memories while keeping a word by word programming mode. However, such a memory including a plurality of high voltage registers is relatively complex to design and is suitable for limited applications only.

SUMMARY OF THE INVENTION

The present invention is based upon the premise of providing FLASH memories having a memory/user interface compatible with an interface of EEPROM memories. On the one hand, such FLASH memories could advantageously replace EEPROM memories in existing applications, providing the benefits of lower cost and the small size of FLASH memories. On the other hand, this would allow a more generalized use of FLASH memories in numerous applications. Furthermore, it could decompartmentalize the market of integrated circuit memories.

An object of the present invention is to provide a FLASH memory comparable with EEPROM memories in terms of adaptability to numerous uses.

It is a further object of the invention to provide such a memory without prohibitive cost increases and without losing storing capacity per silicon surface unit.

These and other objects, features, and advantages in accordance with the present invention are provided by an integrated circuit memory including a main FLASH memory for recording or storing a word presented on its input, without the possibility of recording simultaneously several words in parallel. The integrated circuit memory may also include a buffer memory with a sufficient capacity to store a plurality of words. An output of the buffer memory is coupled to the input of the FLASH memory. Furthermore, a circuit or means is also included for recording into the buffer memory a series of words to be recorded into the FLASH memory and then recording into the FLASH memory the words first recorded into the buffer memory.

More specifically, the integrated circuit memory may include a serial/parallel interface circuit for receiving words to be recorded into the FLASH memory. The serial/parallel interface circuit may also receive data to be recorded, addresses, and recording, erasing or reading instructions of the FLASH memory. Additionally, the integrated circuit memory may include a circuit or means for applying to an address input of the FLASH memory an address received as an input and including M most significant bits and N less significant bits. This circuit or means may also apply to an address input of the buffer memory an address including the N less significant bits of the address applied to the FLASH memory.

Moreover, the N less significant bits may correspond to the address of a word in a page of the FLASH memory, the address of which is defined by the M most significant bits. Also, the N less significant bits may correspond to the address of a word in a physical page of the FLASH memory. This physical page may include all the words present in a word line of the FLASH memory.

The integrated circuit memory may also include a circuit or means for performing a recording instruction of a plurality of words including a code of the instruction, a start address in the FLASH memory, and the series of words to be recorded. An address counter may also be included, the output of which is connected to the address input of the buffer memory and to the less significant address inputs of the FLASH memory.

Furthermore, the integrated circuit memory may include a circuit or means for: i) loading, into the address counter, N less significant bits of a recording address of the first word of the series of words into the FLASH memory; ii) recording the first received word into the buffer memory and recording the following words, incrementing the address counter at each new recording; iii) resetting the address counter; iv) applying M most significant bits of the recording address of the first word to the address input of the FLASH memory, at any time before step v); v) reading the buffer memory at the current address delivered by the address counter; vi) if the value of the word read in the buffer memory is different from the value of an erased word, applying a programming signal to the FLASH memory; and vii) incrementing the address counter and repeating steps v) and vi) until the last N bits of the address are deliverable by the address counter before overload.

The present invention also relates to a method of recording a plurality of words into a FLASH memory including a circuit or means for recording a word without the possibility of recording simultaneously several words in parallel. The method may include providing a buffer memory with a sufficient capacity to store the plurality of words, coupling the output of the buffer memory to the input of the FLASH memory, recording into the buffer memory the series of words sent to the FLASH memory, and recording into the FLASH memory, one after the other, the words recorded in the buffer memory.

More specifically, the words may be received in the form of serial data, and the serial data are restored in words sent to the input of the buffer memory. Furthermore, the series of words may be recorded into the FLASH memory from a specified recording address including M most significant bits and N less significant bits. The words may be recorded into the buffer memory from a reduced address including at least N first bits equal to the N less significant bits of the specified recording address. Also, the reduced address may be incremented after each recording.

Additionally, the method may include applying to the address input of the buffer memory a read address including at least N first bits and reading a word in the buffer memory. Furthermore, an address may be applied to the address input of the FLASH memory that includes the M most significant bits of the specified address and N less significant bits identical to the N first bits of the read address. Also, if the value of the read word is different from the value of an erased word, a record signal of the read word may be applied to the FLASH memory. These three steps may be repeated starting with a read address including at least N first bits equal to "0" until reaching, by successive increments, a read address including N first bits equal to "1".

Moreover, the method may include a checking step that includes repeating the following three steps and starting with a read address including N first bits equal to "0" until reaching, by successive increments, a read address comprising N first bits equal to "1". The first step includes applying the read address to the address input of the buffer memory and reading a word in the buffer memory. The second step includes applying to the address input of the FLASH memory an address including the M most significant bits of the specified address and N less significant bits identical to the N first bits of the read address and reading a word in the FLASH memory. Additionally, the third step includes comparing the word read in the FLASH memory and the word read in the buffer memory.

BRIEF DESCRIPTION OF THE DRAWINGS

These objects, characteristics and advantages as well as others of the present invention will become apparent in the following description of an embodiment of an integrated memory according to the invention, given by way of non-limitative example, in conjunction with the accompanying drawings, in which:

FIGS. 1A, 1B, previously described, are schematic diagrams illustrating arrays of standard prior art EEPROM and FLASH memory cells;

FIGS. 4A through 4F are timing diagrams of various electric signals illustrating a method of recording data into a memory according to the invention.

DETAILED DESCRIPTION OF THE PREFERRED EMBODIMENTS

Figure 2:
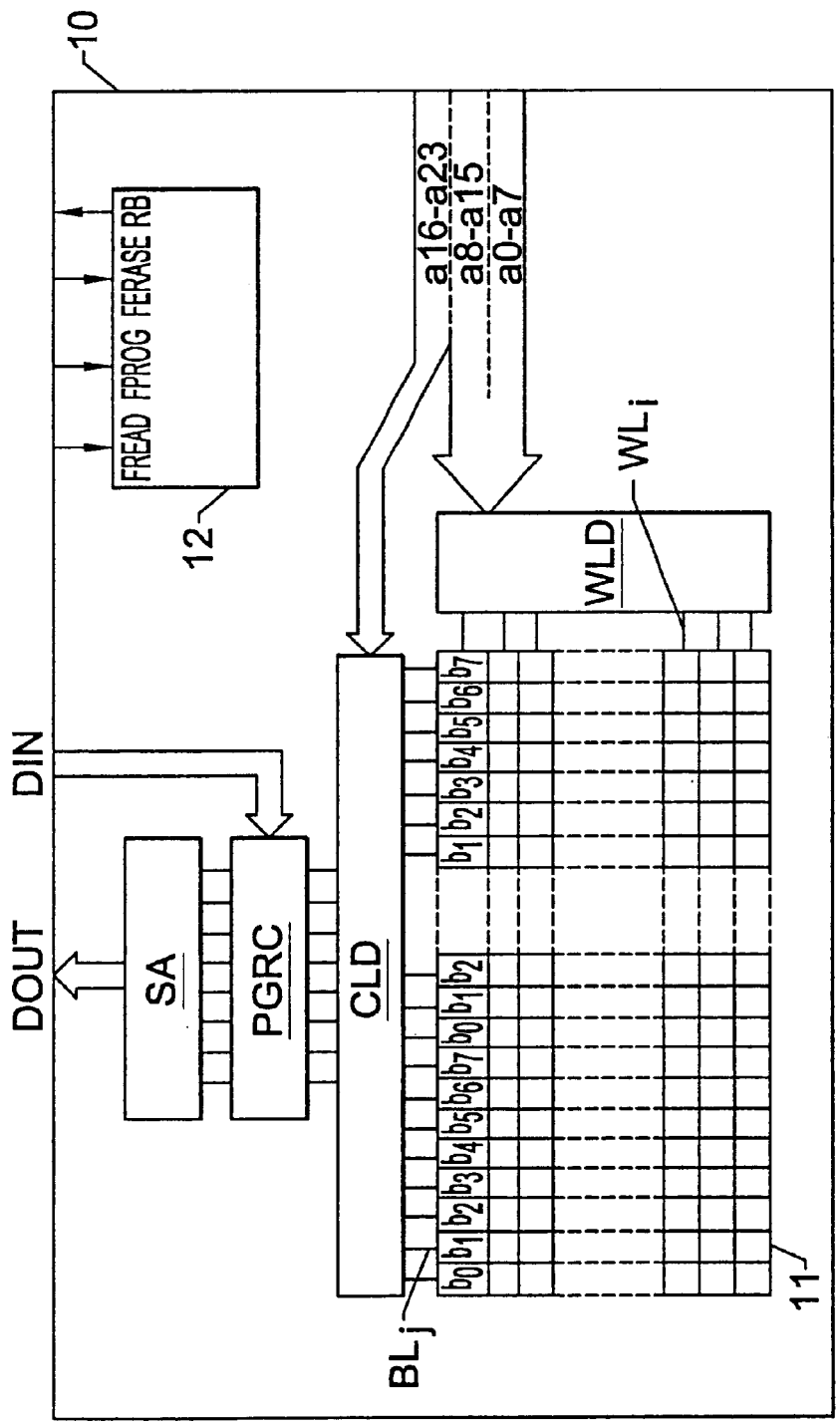
FIG. 2 is a schematic block diagram of the structure of a conventional prior art FLASH memory.

A conventional FLASH memory 10, programmable byte by byte and erasable sector by sector, is shown in FIG. 2. A memory 20 according to the invention, described hereafter with reference to FIG. 3, will be implemented with this memory 10. The memory 10 includes an array 11 of memory cells of the type described above with reference to FIG. 1B, a line decoder WLD connected to the word lines $WL_i$, a column decoder CLD connected to the bit lines $BL_j$, as well as a read circuit SA and a programming buffer register PGRC. The read circuit SA and the programming buffer register PGRC are both connected to the column decoder CLD.

The array 11 includes 256 sectors of 256 pages each, where each page includes 256 words and each word includes 8 memory cells. The memory 10 receives on its address input an address of 24 bits including sixteen most significant bits $a_0$–$a_7$, $a_8$–$a_{15}$ and eight less significant bits $a_{16}$–$a_{23}$. The address bits $a_0$–$a_{15}$ are applied to a word line decoder WLD, and the bits $a_{16}$–$a_{23}$ are applied to a column decoder CLD. The most significant bits $a_0$–$a_7$ correspond to the address of a sector in the array 11. The following bits $a_8$–$a_{15}$ correspond to the address of a physical page in a sector, the physical page including all the words of a word line. The less significant bits $a_{16}$–$a_{23}$ correspond to the address of a column, i.e., the address of a word in a page.

The read circuit SA delivers in parallel on an output DOUT of the memory 10 the eight bits of a word read in the array 11. On the other hand, the eight bits of a word to be programmed are received in parallel on an input DIN of the memory 10 and applied to the programming buffer register PGRC. The register PGRC conventionally includes a series of high voltage programming latches (not shown) each receiving a bit of the word to be programmed. Each of the programming latches also delivers a high programming voltage Vpp when the received bit is equal to "0" (or "1", depending on the chosen convention).

The voltage Vpp, which may be about 5 to 6 V, is propagated in the corresponding bit lines of the array 11 for biasing the drains of the transistors to be programmed (by hot electron injection), while another Vpp voltage with an higher value is applied to the gates of the transistors, as explained above. Contrary to the above referenced French Patent No. FR 2 756 410, the storage capacity of the register PGRC is only one word, here one byte (i.e., 8 programming latches).

These various circuits, registers and decoders are controlled and driven by a set of command, switching and control circuits schematically shown in the form of a block 12. The Block 12 performs a reading operation of a byte upon receiving a signal FREAD, performs a programming operation of a byte upon receiving a signal FPGR, and performs an erasing operation of a sector upon receiving a signal FERASE. Block 12 delivers a signal RB (Ready/Busy) equal to "1" during these operations for the synchronization of the memory 10 with external elements. After erasing a sector, such a conventional memory 10 can program one word only at the same time, as discussed above, because the number of programming latches is insufficient to store more than one word. The word is presented on the input DIN and the signal FPROG is applied to memory 10.

Figure 3:
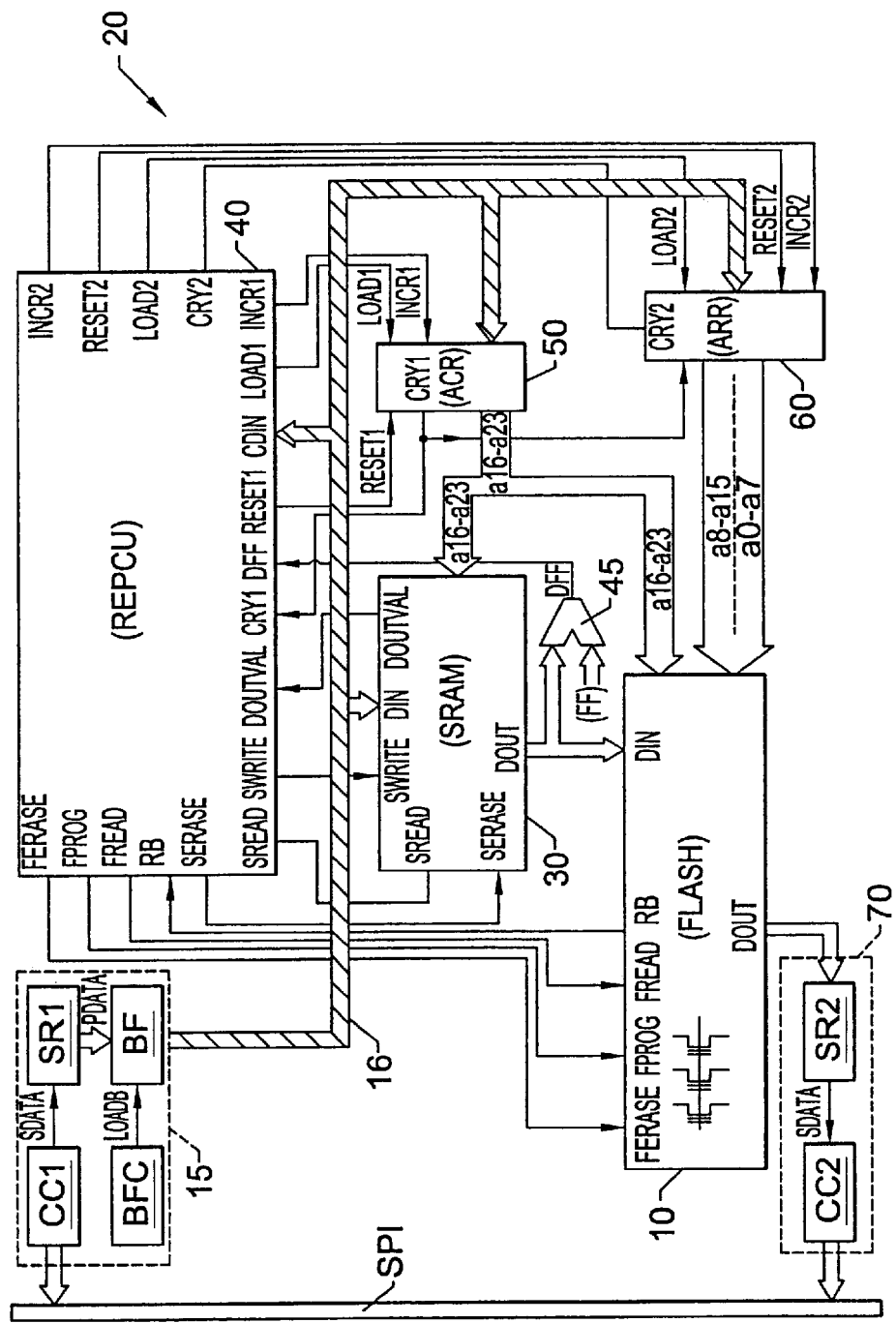
FIG. 3 is a schematic block diagram of the structure of a memory according to the present invention.

The overall structure of a memory 20 according to the present invention, which does not present the above limitation, is shown in FIG. 3. The memory 20 includes a main FLASH memory identical to the one which has been described, with the same reference 10, as well as various peripheral elements. These elements include a serial/parallel interface circuit 15 as an input, an internal data bus 16 (here an eight bit bus), a buffer memory 30 (here a volatile memory of the SRAM type, addressable with 8 bits), a central processing unit 40 or REPCU (Read Erase Program Central Unit) with wired logic, a column address register 50 or ACR (Address Columns Register) of the counter type, a word line address register 60 or ARR (Address Rows Register) also of the type counter, and a parallel/serial interface circuit 70 as an output.

Interface circuit 15 is connected to a serial bus of the SPI type and converts data received in serial form SDATA into parallel data PDATA. This data includes instructions, addresses, and words to be recorded into the main memory 10. Interface circuit 15 includes a conditioning circuit CC1 of the serial data connected to the bus SPI, a shift register SR1 having a serial input and a parallel output, a buffer BF and a frame control circuit BFC (Bus Frame Control). The circuit BFC manages the synchronization between the clock of the internal bus 16 (e.g., 2.5 MHz) and the clock of the bus SPI (e.g., 20 MHz). The data SDATA sent by the bus SPI are conditioned by the circuit CC1 and applied to the register SR1. The latter delivers parallel data PDATA to the input of the buffer BF, the output of which is connected to the internal bus 16. The buffer BF delivers the data PDATA on the internal bus 16 when receiving an instruction LOAD delivered by the synchronization circuit BFC.

The data input DIN of the main FLASH memory 10, which is connected inside the main memory 10 to the programming buffer register PGRC described above in relation with FIG. 2, is connected to the output DOUT of the buffer memory 30. The data input DIN of the buffer memory is connected to the internal bus 16. The input of register 60 is connected to bus 16 and delivers sixteen most significant address bits $a_0$–$a_7$, $a_8$–$a_{15}$ applied to the address input of the main memory 10. The register 50, also connected to bus 16, delivers eight less significant address bits $a_{16}$–$a_{23}$ applied to the address input of the main memory 10, where they combine with the bits $a_0$–$a_{15}$ to form the complete address $a_0$–$a_{23}$ of a word.

The central processing unit 40 controls these various elements and includes an input CDIN connected to bus 16 for receiving, decoding and performing high level instructions. These instructions are received by the external bus SPI and sent on the internal bus 16 by the interface circuit 15. These instructions include, in particular:

1) an instruction for erasing a sector of the main memory 10 including an operation code and the address $a_0$–$a_7$ of the sector to be erased as in the following format, for example:

| $CODE_{ERASE}$ | $a_0$–$a_7$ |
|---|---|

2) an instruction for reading one or more words in the main memory 10 including an operation code, the address $a_0$–$a_{23}$ of the first word to be read and the number n of words to be read, coded on 8 bits (i.e., having the possibility of reading a whole page of 256 words), being, for example, in the following format:

| $CODE_{READ}$ | $a_0$–$a_7$ | $a_8$–$a_{15}$ | $a_{16}$–$a_{23}$ | n |
|---|---|---|---|---|

3) an instruction for recording a series of words into a page of the main memory 10 including an operation code, a start address $a_0$–$a_{23}$ and the words $B_1$ to $B_m$ to be recorded, "m" ranging from 1 (programming one word $B_1$ only) to 256 (programming a whole page) This instruction is, for example, in the following format:

| $CODE_{PGR}$ | $a_0$–$a_7$ | $a_8$–$a_{15}$ | $a_{16}$–$a_{23}$ | $B_1$ | $B_2$ | $B_3$ | ... | $B_m$ |
|---|---|---|---|---|---|---|---|---|

The central processing unit 40 performs these various instructions, and potentially others, by various command and control signals, among which are the following:
Emitted Control Signals:

FERASE: erase signal of a sector of the main memory 10;
FPROG: program signal of a word (byte) in the main memory 10;
FREAD: read signal of a word in the main memory 10;
SWRITE: write signal of a word in the buffer memory 30;
SERASE: erase signal of the buffer memory 30;
SREAD: read signal of a word in the buffer memory 30;
LOAD1: load signal of an address present on the internal bus 16 into register 50;
INCR1: increment signal of register 50;
RESET1: reset signal of register 50;
LOAD2: load signal of an address present on the internal bus 16 into register 60;
INCR2: increment signal of register 60; and
RESET2: reset signal of register 60.

Received Control Signals:

RB (Ready/Busy): synchronization signal sent by the main memory 10, set to "1" during reading, programming or erasing operations;
DOUTVAL: signal sent by the buffer memory 30 and set to "1" when the output DOUT of the memory is valid, after application of the read signal SREAD;
CRY1 (Carry): overload signal of register 50, also applied to the increment input of register 60;
CRY2 (Carry): overload signal of register 60.

According to the invention, performing the erasing instruction of a sector of the main memory 10 includes decoding the operation code $CODE_{ERASE}$ by the central processing unit 40, loading into the register 60 the address $a_0$–$a_7$ of the sector to be erased, and applying the signal FERASE to the main memory 10. Performing the reading instruction of one or more words in the main memory 10 includes decoding the operation code $CODE_{READ}$, loading the address bits $a_0$–$a_{15}$ into the register 60, loading the address bits $a_{16}$–$a_{23}$ into the register 50, and applying "n" read signals FREAD to the main memory 10.

The number "n" determines the number of read cycles (signal FREAD) to be applied to the main memory 10, incrementing the address register 50 before each new reading. The data delivered by the main memory 10 are sent on the bus SPI by the parallel/serial circuit 70. The latter includes a shift register SR2, the input of which is connected to the parallel output DOUT of the main memory 10. The shift register SR2 delivers serial data SDATA to the bus SPI by an output signal conditioning circuit CC2.

The central processing unit 40 performs a recording instruction of a series of words $B_1$–$B_m$ into a page of the main memory 10 (which is imperatively preceded by an erasing instruction of the sector concerned) in three phases. These phases are:

i) reading the instruction including decoding the operation code $CODE_{PGR}$, loading the address bits $a_0$–$a_{15}$ into register 60, and loading the address bits $a_{16}$–$a_{23}$ into register 50;

ii) recording the words $B_1$ to $B_m$ into the buffer memory 30 including a plurality of elementary recording steps of each word received on the internal bus 16, which is performed responsive to the signal FWRITE; and iii) reading the words $B_1$ to $B_m$ recorded in the buffer memory 30 and recording these words into the main memory 10 including a plurality of elementary reading steps of each word, performed by the signal SREAD, and recording the read word into the main memory 10, which is performed responsive to the signal FPROG.

From the outside, phase iii) is transparent to the user, and the memory 20 according to the invention operates like a page by page programming EEPROM memory. The memory 20 thus has the advantages of an EEPROM memory in terms of adaptability to multiple uses and the advantages of a FLASH memory in terms of integration density. It should be noted that the silicon surface occupied by the various elements added to the main memory 10 is negligible in relation to the surface occupied by the main memory 10 itself.

In order to reduce the size and the complexity of these peripheral elements as much as possible, the present invention provides an advantageous method allowing the implementation of phases ii) and iii) above without necessarily providing a register for storing the start address supplied by the instruction, or a counter of the number of words recorded in the buffer memory 30. This method is first based on two hardware arrangements. The first arrangement includes applying to the address input of the buffer memory 30 the eight less significant address bits $a_{16}$–$a_{23}$ delivered by register 50. These represent the address of a word (column) in a page of the main memory 10.

The second arrangement includes providing a means for detecting, at the output of the buffer memory 30, the presence of a word including bits at "1" only, corresponding to an erased word in the main memory 10 (the erased cells of a FLASH memory being, by convention, at "1", as discussed above). As illustrated in FIG. 3, this means may be, for example, a logic comparator 45 receiving the output of the buffer memory 30 on a first input, and, on a second input, an order equal to "FF" in hexadecimal notation (i.e., eight bits at "1"). The comparator 45 delivers a signal DFF, which is at "1" when the output of the buffer memory is equal to "FF".

Thus, when phase ii) starts, the buffer memory 30 receives on its address input the less significant address $a_{16}$–$a_{23}$ supplied by the recording instruction, stored by the register 50. This address may not be zero, so that the recording of the words $B_1$–$B_m$ into the buffer memory 30 may start at any point of the buffer memory defined by this address. At each new recording, the register 50 is incremented by one until the last word is recorded. At the end of phase ii), the content of the buffer memory 30 is thus identical to the content that the selected page of the main memory 10 will have to present at the end of phase iii). The start address $a_{16}$–$a_{23}$ is lost, as register 50 has been incremented "n" times and no register for keeping the initial address has been provided.

According to the invention, phase iii) includes reading all the content of the buffer memory 30 from address zero and applying the signal RESET1 to register 50 until register 50 emits the overload signal CRY1. At each reading of the buffer memory, the binary word present on the output DOUT is recorded into the main memory 10 if it is different from "FF", or is not recorded if it is equal to "FF". In fact, the sector of the main memory 10 in question has been first erased and includes only words equal to "FF". It is therefore useless to start a programming operation, which only allows the writing of "0", if the word to be recorded is equal to "FF".

To better aid in understanding, FIGS. 4A to 4F show four first steps of phase iii) according to the invention. The first step E1 is started after the recording of the received words $B_1$–$B_m$ into the buffer memory 30, and includes the steps of reading the buffer memory by setting the signal SREAD to "1" (FIG. 4B), waiting for the output of the buffer memory to be valid (signal DOUTVAL at "1", FIG. 4C), and checking that the word delivered by the buffer memory is different from "FF" (signal DFF at "0", FIG. 4D). If the word is different from "FF", the word is recorded into the main memory 10 (program signal FPROG, FIG. 4E). The first step E1 further includes waiting for the programming operation to be finished (signal RB at "0", FIG. 4F), then releasing the read signal SREAD (FIG. 4B, the signal DOUTVAL passes then to "0" in FIG. 4C) and passing to the following step E2.

The following step E2 is identical to step E1 except that it includes a preliminary step of incrementing the register 50 (signal INCR1 at "1", FIG. 4A). The step E3, as represented in FIGS. 4A to 4F, illustrates the case where the output of the buffer memory delivers a word equal to "FF". In this case, the signal DFF passes to "1" (FIG. 4D) and the signal FPROG is not applied to the main memory 10. The central processing unit directly passes to the following step, which is here identical to step E2.

Thus, after the first step E1, phase iii) of the method according to the invention includes a succession of steps of the type E2 or of the type E3. If, for example, the first word has been recorded in the buffer memory at the address 00001111, there will be 256 reading steps of the type E3, which will be performed without starting a programming operation in the main memory 10.

At the end of phase iii), the central processing unit erases (in principle) the buffer memory by the signal SERASE and erases registers 50, 60 by the signals RESET1, RESET2. However, before performing this erasing, an advantageous alternative of the method of the invention includes a final checking step. This step includes performing a parallel reading of the main memory 10 and the buffer memory 30 and comparing the data delivered by each of the memories. In this case, register 50 is reset and the central processing unit 40 scans, incrementing register 50, all the less significant addresses $a_{16}$–$a_{23}$ within the page defined by the most significant address bits $a_0$–$a_{15}$ stored in register 60. The words read in parallel in the two memories 10, 30 are, for example, applied to the two inputs of an 8 bit comparator (not shown), the output of which drivers a latch. The latch output passes to "1" if two words read in parallel are not identical. This checking process allows, for example, the memory 20 to send an error signal indicating to the user that the recording operation is erroneous and must be made again.

It will be clearly apparent to those skilled in the art that the present invention is likely to have various other alternative embodiments and improvements. In particular, is has been indicated above that the buffer memory 30 receives the less significant address bits $a_{16}$–$a_{23}$ defining the address of a word in a page. Even so, nothing prevents the method of the invention from being extended to the recording of a whole sector (or even more), applying the 16 last address bits $a_8$–$a_{23}$ to the buffer memory. In practice, a compromise will have to be made between the storing capacity of the buffer memory, the size, and the cost of the memory 20.

Conversely, the buffer memory 30 may also receive on its address input only a portion of the less significant address bits $a_{16}$–$a_{23}$. This may be used to define a page programming mode wherein the pages are logic pages having a size smaller than the physical pages of the main memory 10. Also, the buffer memory 30 may include, in addition to the address inputs receiving the bits $a_{16}$–$a_{23}$ (or more), most significant address inputs controlled by the central processing unit 40. This allows the delimitation of additional pages in the buffer memory, which can be used to store operating data, parameters of memory 20, or any other useful data.

In general, there has been described above a memory 20 presenting a flexibility which is found in the prior art only with EEPROM memories. The memory 20 includes four main characteristics which may be separated one from another. These have been combined in the described embodiment to obtain a FLASH memory able to replace a conventional EEPROM memory with a serial input/output and with page programming. To summarize, these characteristics are: 1) providing a serial/parallel interface, which may be complete (operation codes, addresses and data) or partial (data only); 2) providing a buffer memory allowing the simulation of the page mode programming of EEPROM memories; 3) providing a central processing unit performing high level reading or programming instructions (these instructions could indeed be driven from outside); and 4) providing a page mode simulation method which does not require the use of a register for storing the start address to reduce the silicon surface necessary for implementation of the peripheral elements.

Although the structure of the central processing unit has not been described in the foregoing for the sake of simplicity, the practical design of such a central processing unit in the form of a wired logic sequential circuit will be understood by those skilled in the art in light of the information disclosed herein. The same applies to the interface circuits 15, 70, the design of which depends in practice on the type of serial bus to which memory 20 according to the invention has to be connected (RS232, I2C, SPI, etc.).

That which is claimed is:

1. An integrated circuit memory comprising:
a main memory of the FLASH type comprising a set of programming latches for causing a word presented on a data input of said main memory to be recorded therein, the set of programming latches being insufficient to record simultaneously several words in parallel;

a buffer memory having an output coupled to the input of said main memory, said buffer memory having a sufficient capacity to record a series of words to be recorded in said main memory; and a controller for first causing the series of words to be recorded in said buffer memory and then causing the series of words to be recorded one after another in said main memory through the set of programming latches.

2. The integrated circuit memory of claim 1 wherein said controller causes the series of words to be recorded in said buffer memory by applying to said buffer memory an address comprising at least N first bits equal to N least significant bits of a recording address of a first word of the series of words, the address applied to said buffer memory being incremented after each word has been recorded.

3. The integrated circuit memory of claim 2 wherein said controller further causes the words first recorded in said buffer memory to be recorded one after another in said main memory by applying thereto an address comprising M most significant bits and N least significant bits and by applying to said buffer memory an address comprising the N least significant bits of the address applied to said main memory, the address applied to said main memory being incremented after each word has been recorded.

4. The integrated circuit memory of claim 3 herein the N less significant bits correspond to the address of a word in a physical page of said main memory comprising all the words present in a word line of said main memory.

5. The integrated circuit memory of claim 3 further comprising an address counter having an output connected to an address input of said buffer memory and to N less significant address inputs of said main memory.

6. The integrated circuit memory of claim 5 wherein said controller:

loads into said address counter the N less significant bits of the recording address of the first word of the series of words;

causes the first word to be recorded in said buffer memory followed by the remaining series of words and causes said address counter to increment with each word recorded;

resets said address counter;

applies said M most significant bits of the recording address of the first word to the address input of said main memory;

causes said buffer memory to be read at a current address delivered by said address counter;

applies a programming signal to said main memory if a value of a word read in the buffer memory is different from a value of an erased word; and increments said address counter, repeats reading said buffer memory and applies the programming signal until a last address deliverable by said address counter before an overload thereof is reached.

7. The integrated circuit memory of claim 1 further comprising a serial/parallel interface circuit for receiving the series of words to be recorded in said main memory.

8. The integrated circuit memory of claim 1 further comprising a checking circuit for checking a writing operation, said checking circuit comparing the words recorded in said main memory and the words recorded in said buffer memory after a transfer of the words into said main memory and before erasing said buffer memory.

9. The integrated circuit memory of claim 1 further comprising a circuit for performing a recording instruction for the series of words where the recording instruction comprises a code of the instruction, a start address in said main memory, and a series of words to be recorded.

10. The integrated circuit memory of claim 1 wherein said controller comprises:

a central processing unit;

a column address register associated with said central processing unit; and a word line address register associated with said central processing unit.

11. An integrated circuit memory comprising:

a main memory of the FLASH type;

programming devices associated with said main memory for causing a word presented on a data input of said main memory to be recorded therein, the programming devices being insufficient to record simultaneously several words in parallel;

a buffer memory having an output coupled to the input of said main memory; and a controller for causing a series of words to be recorded in said buffer memory and causing the series of words to be recorded one after another in said main memory through the programming devices.

12. The integrated circuit memory of claim 11 wherein said controller causes the series of words to be recorded in said buffer memory by applying to said buffer memory an address comprising at least N first bits equal to N least significant bits of a recording address of a first word of the series of words, the address applied to said buffer memory being incremented after each word has been recorded.

13. The integrated circuit memory of claim 11 wherein said controller further causes the words first recorded in said buffer memory to be recorded one after another in said main memory by applying thereto an address comprising M most significant bits and N least significant bits and by applying to said buffer memory an address comprising the N least significant bits of the address applied to said main memory, the address applied to said main memory being incremented after each word has been recorded.

14. The integrated circuit memory of claim 11 further comprising an address counter having an output connected to an address input of said buffer memory and to N less significant address inputs of said main memory.

15. The integrated circuit memory of claim 11 further comprising a serial/parallel interface circuit for receiving the series of words to be recorded in said main memory by said buffer memory.

16. The integrated circuit memory of claim 11 further comprising a checking circuit for checking a writing operation, said checking circuit comparing the words recorded in said main memory and the words recorded in said buffer memory after a transfer of the words into said main memory and before erasing said buffer memory.

17. The integrated circuit memory of claim 11 wherein said controller comprises:

a central processing unit;

a column address register associated with said central processing unit; and a word line address register associated with said central processing unit.

18. A method of recording a series of words in a FLASH memory comprising a set of programming latches for causing a word present at a data input of the FLASH memory to be recorded therein, the set of programming latches being insufficient to record simultaneously several words in parallel, the method comprising:

provuding a buffer memory with a sufficient capacity to record the series of words and coupling an output of the buffer memory to the data input of the FLASH memory;

sending the series of words to the FLASH memory;

recording the series of words sent to the FLASH memory in the buffer memory; and recording the words recorded in the buffer memory in the FLASH memory one after another using the programming latches.

19. The method of claim 18 wherein recording the series of words sent to the FLASH memory comprises applying to the buffer memory an address comprising at least N first bits equal to the N least significant bits of a recording address of the first word of the series of words, the address applied to the buffer memory being incremented after each word has been recorded.

20. The method of claim 19 wherein recording the words recorded in the buffer memory in the FLASH memory comprises:

applying to the FLASH memory an address comprising M most significant bits and N less significant bits; and applying to the buffer memory an address comprising the N least significant bits of the address applied to the FLASH memory, the address applied to the FLASH memory being incremented after each word has been recorded.

21. The method of claim 18 wherein the series of words are received in the form of serial data and the serial data are restored in words sent to the input of the buffer memory.

22. The method of claim 18 further comprising:

applying to an address input of the buffer memory a read address comprising at least N first bits and reading a word in the buffer memory;

applying to the address input of the FLASH memory an address comprising M most significant bits of a recording address of a first word of the series of words and N less significant bits identical to the N first bits of the read address;

applying to the FLASH memory a record signal of a read word if a value of the read word is different from a value of an erased word; and repeating the applying steps starting with a read address comprising at least N first bits equal to 0 until reaching by successive increments a read address comprising N first bits equal to 1.

23. The method of claim 18 further comprising:

applying a read address to an address input of the buffer memory and reading a word in the buffer memory;

applying to an address input of the FLASH memory an address comprising M most significant bits of a recording address of a first word of the series of words and N less significant bits identical to N first bits of the read address and reading a word in the FLASH memory;

comparing the word read in the FLASH memory and the word read in the buffer memory; and repeating the applying and comparing steps starting with a read address comprising N first bits equal to 0 until reaching by successive increments a read address comprising N first bits equal to 1.

24. A method of recording a series of words in a FLASH memory comprising:

coupling an output of a buffer memory to a data input of the FLASH memory;

sending the series of words to the FLASH memory;

recording the series of words sent to the FLASH memory in the buffer memory; and recording the words recorded in the buffer memory in the FLASH memory one after another using programming latches, the programming latches being insufficient to record simultaneously several words in parallel.

25. The method of claim 24 wherein recording the series of words sent to the FLASH memory comprises applying to the buffer memory an address comprising at least N first bits equal to the N least significant bits of a recording address of the first word of the series of words, the address applied to the buffer memory being incremented after each word has been recorded.

26. The method of claim 25 wherein recording the words recorded in the buffer memory in the FLASH memory comprises:

applying to the FLASH memory an address comprising M most significant bits and N less significant bits; and applying to the buffer memory an address comprising the N least significant bits of the address applied to the FLASH memory, the address applied to the FLASH memory being incremented after each word has been recorded.

27. The method of claim 24 wherein the series of words are received in the form of serial data and the serial data are restored in words sent to the input of the buffer memory.

28. The method of claim 24 further comprising:

applying to an address input of the buffer memory a read address comprising at least N first bits and reading a word in the buffer memory;

applying to the address input of the FLASH memory an address comprising M most significant bits of a recording address of a first word of the series of words and N less significant bits identical to the N first bits of the read address;

applying to the FLASH memory a record signal of a read word if a value of the read word is different from a value of an erased word; and repeating the applying steps starting with a read address comprising at least N first bits equal to 0 until reaching by successive increments a read address comprising N first bits equal to 1.

29. The method of claim 24 further comprising:

applying a read address to an address input of the buffer memory and reading a word in the buffer memory;

applying to an address input of the FLASH memory an address comprising M most significant bits of a recording address of a first word of the series of words and N less significant bits identical to N first bits of the read address and reading a word in the FLASH memory;

comparing the word read in the FLASH memory and the word read in the buffer memory; and repeating the applying and comparing steps starting with a read address comprising N first bits equal to 0 until reaching by successive increments a read address comprising N first bits equal to 1.

* * * * *